United States Patent
Dunn et al.

(10) Patent No.: US 7,916,763 B2
(45) Date of Patent: Mar. 29, 2011

(54) CURRENT DRIVEN FREQUENCY-STEPPED RADIATION SOURCE AND METHODS THEREOF

(75) Inventors: Thomas James Dunn, Penfield, NY (US); Christopher Alan Lee, Pittsford, NY (US); Mark Joseph Tronolone, Webster, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 12/614,885

(22) Filed: Nov. 9, 2009

(65) Prior Publication Data

US 2010/0128745 A1     May 27, 2010

Related U.S. Application Data

(60) Provisional application No. 61/118,223, filed on Nov. 26, 2008, provisional application No. 61/118,162, filed on Nov. 26, 2008.

(51) Int. Cl.
*H01S 3/10*     (2006.01)
*H01S 3/13*     (2006.01)
*H01S 3/00*     (2006.01)

(52) U.S. Cl. .................. 372/20; 372/29.015; 372/38.07
(58) Field of Classification Search .................. 372/19, 372/20, 29.011, 29.015, 38.01, 38.07, 102
See application file for complete search history.

(56) References Cited

U.S. PATENT DOCUMENTS

| | | | |
|---|---|---|---|
| 6,690,690 B2 | 2/2004 | Marron | 372/20 |
| 7,133,194 B1 | 11/2006 | Kwon et al. | 359/337.21 |
| 7,209,499 B2 | 4/2007 | Farmiga et al. | 372/20 |
| 7,259,860 B2 | 8/2007 | Marron et al. | 356/451 |
| 7,268,889 B2 | 9/2007 | Kulawiec et al. | 356/511 |

FOREIGN PATENT DOCUMENTS

WO     WO2006/112971     10/2006

OTHER PUBLICATIONS

Nellen, M., Tiefenthaler, K., Lukosz, W., *Integrated Optical Input Grating Couplers as Biochemical Sensors*, (1988) *Sensors and Actuators*, 15, pp. 285-295.

*Primary Examiner* — Armando Rodriguez
(74) *Attorney, Agent, or Firm* — John L. Haack

(57) ABSTRACT

A wavelength tunable system including: a laser having a lasing cavity and an external cavity; a frequency-adjuster in the external cavity; and an adjustable current source to adjust the laser diode current, and a method of use as defined herein.

11 Claims, 5 Drawing Sheets

CURRENT DRIVEN FREQUENCY-STEPPED RADIATION SOURCE AND METHODS THEREOF

This application claims the benefit of U.S. Provisional Ser. No. 61/118,223, filed on Nov. 26, 2008. The content of this priority document and the entire disclosure of any publication, patent, or patent document mention herein is incorporated by reference.

CROSS-REFERENCE TO RELATED COPENDING APPLICATION

U.S. Provisional Patent Application No. 61/118,162 filed on Nov. 26, 2008, entitled "LITTMAN CONFIGURED FREQUENCY STEPPED LASER."

BACKGROUND

The disclosure relates to a wavelength tunable radiation source and more specifically to a frequency-stepped laser system and methods thereof.

SUMMARY

In embodiments, the disclosure provides a frequency-stepped laser system based on current control and to methods of making and using the system. In embodiments, the disclosure provides a system and method that significantly increases the number of frequency-steps within the same gain bandwidth and provides significantly improved frequency resolution.

BRIEF DESCRIPTION OF THE DRAWING(S)

FIGS. 1A and B show a perspective and a schematic, respectively, of a frequency-stepped laser having a rotatable grating and two mode matched cavities, a laser diode cavity ($L_d$) and external cavity ($L_e$), that provide for the optical path length of the external cavity to be an integer multiple of the optical path length of the laser diode cavity, in embodiments of the disclosure.

DETAILED DESCRIPTION

Figure 1A:
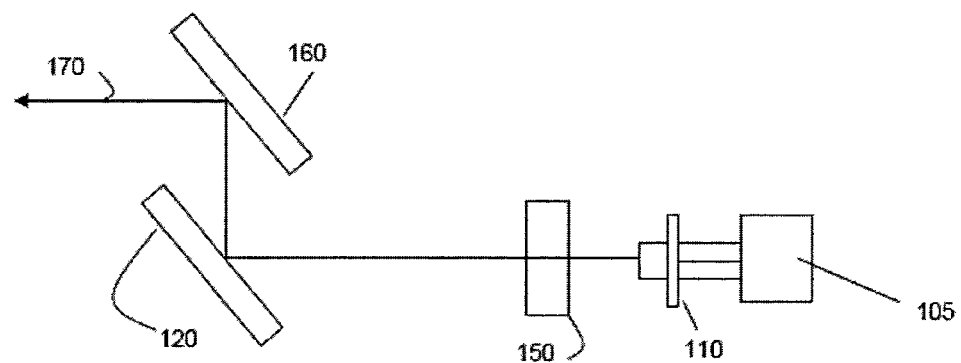

Various embodiments of the disclosure will be described in detail with reference to drawings, if any. Reference to various embodiments does not limit the scope of the invention, which is limited only by the scope of the claims attached hereto. Additionally, any examples set forth in this specification merely set forth some of the many possible embodiments for the claimed invention.

Definitions

"Wavelength tunable" or like terms refer to, for example, a laser source whose instantaneous frequency or wavelength output can be changed in a controlled manner.

"Frequency-stepped" or like terms refer to, for example, a laser source whose instantaneous frequency or wavelength output can be one of a discrete number of possible frequencies or wavelengths.

"Longitudinal mode" or like terms refer to, for example, one of the discrete number of possible frequencies or wavelengths that are associated with the standing wave pattern formed by the laser radiation in the laser cavity. Longitudinal modes obey the relationship:

$$L = n\lambda/2$$

where L is the optical path length of the laser (with or without external cavity), $\lambda$ is the laser radiation wavelength, and n is the mode number.

"Include," "includes," or like terms means including but not limited to.

"About" modifying, for example, the quantity or measure of a component, element, or aspect of the disclosure, e.g., angle, distance, a thickness, and like values, and ranges thereof, employed in describing the embodiments of the disclosure, refers to variation in the numerical quantity that can occur, for example: through typical measuring and handling procedures used for making or using the apparatus, the methods, and its parts; through inadvertent error in these procedures; through differences in the manufacture or source of materials or ingredients used to carry out the methods; and like considerations. Claims appended hereto modified by the term "about" include equivalents of these quantities.

"Consisting essentially of" in embodiments refers, for example, to a current driven frequency-stepped radiation source and methods thereof, such as a wavelength tunable system including: a laser having a lasing cavity and an external cavity; a frequency-adjuster in the external cavity; and an adjustable current source to adjust the laser diode current. The source and system provide a frequency-stepped laser apparatus, and a method of making or using the system, and can include the components or steps listed in the claim, plus other components or steps that do not materially affect the basic and novel properties of any of the articles, apparatus, or system, and methods of making and use of the disclosure, such as particular components, particular materials, particular configurations, particular conditions, or like structure, material, or process variable selected. Items or aspects that may materially affect the basic properties of the components, configurations, or steps of the disclosure or that may impart undesirable characteristics to the present disclosure include, for example, non-rotational relative motion of the diffraction grating or lateral displacement of optical components.

Thus, the claimed invention may suitably comprise, consist of, or consist essentially of, for example, an apparatus or system as defined herein; and a method for making and using the system as defined herein.

The indefinite article "a" or "an" and its corresponding definite article "the" as used herein means at least one, or one or more, unless specified otherwise.

Abbreviations, which are well known to one of ordinary skill in the art, may be used (e.g., "h" or "hr" for hour or hours, "GHz" for gigahertz, "nm" for nanometers, and like abbreviations).

Specific and preferred values disclosed for components, configurations, orientations, and like aspects, and ranges thereof, are for illustration only; they do not exclude other defined values or other values within defined ranges. The apparatus, system, and methods of the disclosure include those having any value or any combination of the values, specific values, more specific values, and preferred values described herein.

Tunable laser systems are known, see e.g., WO2006112971, entitled "MODE-MATCHING SYSTEM FOR TUNABLE EXTERNAL CAVITY LASER"; U.S. Pat. No. 7,209,499, entitled "MODE-SELECTIVE FREQUENCY TUNING SYSTEM"; U.S. Pat. No. 7,268,889, entitled "PHASE-RESOLVED MEASUREMENT FOR FREQUENCY SHIFTING INTERFEROMETRY"; U.S. Pat. No. 7,259,860, entitled "OPTICAL FEEDBACK FROM MODE-SELECTIVE TUNER"; and U.S. Pat. No. 6,690,690, entitled "TUNABLE LASER SYSTEM HAVING AN ADJUSTABLE EXTERNAL CAVITY."

The above patents mention a tunable laser system that incorporates a standard uncoated laser diode, which is coupled into an external cavity, which cavity has a grating in the Littrow configuration. The grating angle can be adjusted to change the wavelength of the light that is fed-back into the laser diode. The grating can be pivoted about an axis that is co-planar with the face of the grating and the pivot axis is parallel to the rulings on the grating face. The length of the external cavity is selected so that it is mode-matched to the fundamental laser diode. As the grating angle is continuously changed, the frequency of the laser's output beam will change in discrete frequency steps referred to as mode-hops. In an ideal mode-matched condition, the mode-hops or frequency-steps are determined by the length of the fundamental laser diode and its optical index of refraction.

In use, a tunable laser can be "stepped" through all of the longitudinal modes of the fundamental laser diode that fit within the gain bandwidth of the laser. There are some uses in which smaller frequency steps are desired so that there are many more steps that can fit within the gain bandwidth of the laser diode.

There are tunable laser systems that use different tuning methodologies that permit "continuous tuning" without or free-of any, mode-hops. These tunable laser systems use a laser diode in which one of the diode facets has a specialty anti-reflective (AR) coating. The mode structure of the laser is determined solely by the combined optical length of the external cavity and the laser diode cavity. There are no competing modes that arise from only the laser diode itself. The length of the external cavity can be changed while the grating angle is changed so that the same mode can be used across the tuning bandwidth. However, this continuous tuning technique is not well suited for tuning to a comb of frequencies. A typical comb of frequencies comprises, for example, a set of frequencies separated by about 50 GHz between 775 nm and 795 nm. The continuous tuning technique suffers from at least two fundamental deficiencies including, for example: the anti-reflective coatings are difficult to manufacture and to control their quality; and small grating angle changes can result in frequency changes.

External cavity tunable lasers having either the Littman or Littrow configurations are known, see for example, U.S. Pat. No. 7,133,194, entitled "Wavelength Tunable Light Source Integrated with Optical Amplifier, Beam Steering Unit, and Concave Diffraction Grating," and FIGS. 1 and 2 therein. However, these configurations attempt to achieve continuous tuning by tracking the same cavity mode across the tuning bandwidth. This requires that the external cavity length be changed in a controlled manner during tuning. In contrast, when frequency-stepped tuning is accomplished according to the present disclosure the external cavity length is fixed and mode-matched to the fundamental laser diode.

Existing tunable laser systems that try to achieve continuous tuning without mode hops require that excellent anti-reflective coatings be applied on the fundamental laser diode exit facet. The anti-reflective coatings can be expensive, and have failed in the field leading to short laser lifetimes. These continuously tunable lasers also have certain inherent limitations, for example, in applications which require a repeatable scan over a pre-determined set of frequencies. Since these lasers are "continuously tunable" small angle errors can result in significant frequency errors. This shortcoming requires that a significant amount of scanning time be spent on "settling" to minimize frequency errors. This can lead to low throughput.

We previously reported a tunable laser system that eliminates the abovementioned limitations by using a frequency-stepping or "stepped" configuration where the external cavity tunable laser length is fixed or held constant as the laser is tuned across the bandwidth, see for example the abovementioned patent documents: WO2006112971, U.S. Pat. Nos. 7,209,499, 7,268,889, 7,259,860, and 6,690,690. The frequency-stepped lasers in these patent documents use a Littrow configuration in which the grating is pivotally adjustable so that it can be angle-tuned to retro-reflect the first ($1^{st}$) order back into the laser cavity. Such a laser exhibits frequency-steps or mode-hops that can be characterized by the optical cavity length of the fundamental laser diode. Different fundamental laser diode cavity modes can be swept by angle-tuning the grating through the laser bandwidth. The grating is part of the external cavity which can be mode-matched to the laser diode.

The abovementioned commonly owned and assigned patents or patent publications provided a tunable laser technology that eliminated the abovementioned limitations. However, the frequency-step size remained limited to the longitudinal mode spacing associated with the fundamental laser diode, for example, of about 30 to about 50 GHz.

In embodiments, the present disclosure provides a system and method that affords, for example, at least three to four times the number of frequency-steps within the same gain bandwidth as compared to a conventional laser diode. This result provides a much higher frequency resolution (e.g., by the same factor of about 3 to about 4).

In embodiments, the disclosure provides an apparatus and method for achieving a greater number of frequency-stepped laser scans having smaller frequency steps or increments than can be achieved with current equipment and methods. In addition to the abovementioned mode-matched cavity, there is an even finer mode structure from the external mode-matched cavity that can be realized and beneficially used. A tunable laser or equivalent radiation source can be repeatedly swept through a different series of laser modes by changing the laser current between each series of scans. This changes the relative alignment of the external cavity modes with the fundamental laser diode modes. Each scan will still manifest the same size frequency-steps associated with the optical cavity length of the fundamental laser diode, but each successive scan will be shifted in absolute frequency, e.g., about 8 GHz, by an amount associated with the cavity length of the external cavity. After repeatedly scanning all the diode modes at different currents, this results in a much higher resolution frequency-stepped scan.

In embodiments, the present disclosure enables an apparatus and method that can step to laser frequencies that are associated with the finer mode spacing of the external cavity, which affords a frequency resolution improvement of, for example, about 2 to about 10 times, about 3 to about 6 times, and about 4 to about 5 times, including intermediate values and their ranges.

In embodiments, the apparatus and method of the disclosure enables frequency-stepped laser scans having higher spectral resolution than previously achievable. The apparatus and methods of the present disclosure are superior compared to known systems, by providing at least reduced costs of manufacture and use, simplicity of function and alignment, improved reliability and resolution, and like considerations.

Figure 1B:
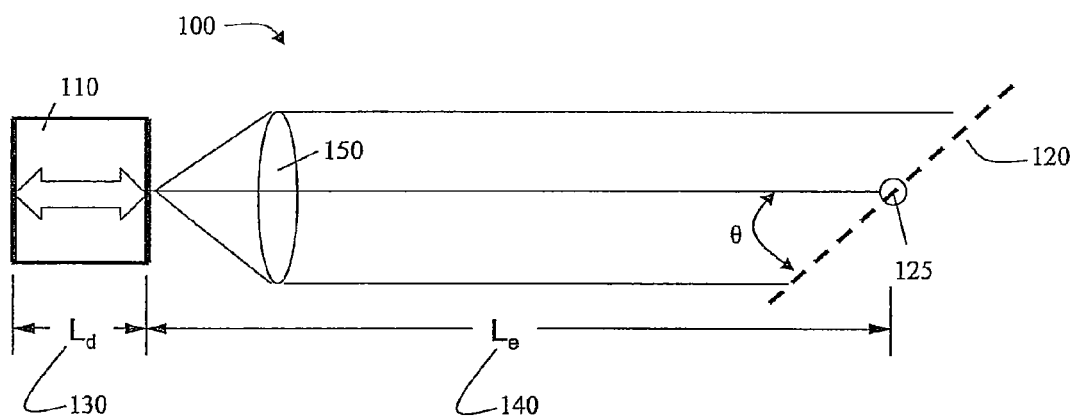

Referring to the Figures, FIGS. 1A and 1B provide a perspective and schematic, respectively, of the disclosed apparatus (100) comprising a diode laser with a conventional uncoated exit facet (110) having a rotatable grating (120) and two mode-matched cavities, including a laser diode cavity ($L_d$) (130) and an external cavity (140), that provide for the optical length of the external cavity to be an integer multiple of the optical length of the laser diode cavity. A standard uncoated laser diode can be coupled into an external cavity by a collimating lens (150). The external cavity incorporates the grating (120) in the Littrow configuration. The grating angle ($\theta$) can be adjusted so that the first order reflection can be directed back into the laser diode. By making small changes to the grating angle ($\theta$) about the grating rotational axis (125) the wavelength of the light that is fed back into the laser diode is changed and in-turn changes the emitted laser wavelength. The grating pivots about the axis (125) which axis is co-planar with the face of the grating and the axis is parallel to the rulings on the grating face (not shown). In embodiments, optional mirror (160) can be used, for example, for directing the tunable laser output beam (170) and for retro-reflection or feed-back.

Figure 2:
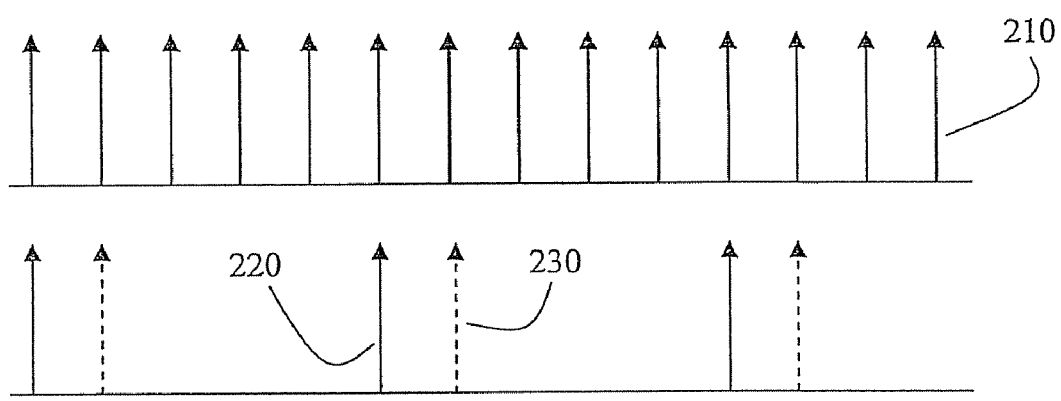
FIG. 2 shows representative longitudinal modes associated with the laser diode cavity and external cavity in a mode-matched condition, in embodiments of the disclosure.

The length of the external cavity ($L_e$) (140) can be selected so that it is mode-matched to the fundamental laser diode, as shown in FIG. 2. The spacing of the modes (210) of the external cavity is about an integer multiple of the spacing of the longitudinal modes of the laser diode cavity (220). As the grating angle is continuously changed, the laser frequency changes in discrete frequency-steps called mode-hops. In an ideal mode-matched condition, the mode-hops or frequency-steps are determined by the length of the fundamental laser diode and its optical index of refraction. FIG. 2 shows the longitudinal modes associated with the laser diode cavity and external cavity in a mode-matched condition. The two cavities are mode-matched since each of the laser diode cavity modes is aligned to an external cavity mode. In this instance, the optical length of the external cavity is, for example, about five (5) times that of the laser diode cavity, since every fifth external cavity mode (210) is aligned with an associated laser diode mode (220). By changing the laser diode current with the adjustable current source (105) shown in FIG. 1A, the laser diode modes can be aligned with a different set of external cavity modes. Two different sets of laser diode modes (220) and (230) are shown in which the laser diode current, $I_1$ and $I_2$ respectively, can be adjusted to align the laser diode modes with a different set of external cavity modes.

Figure 3:
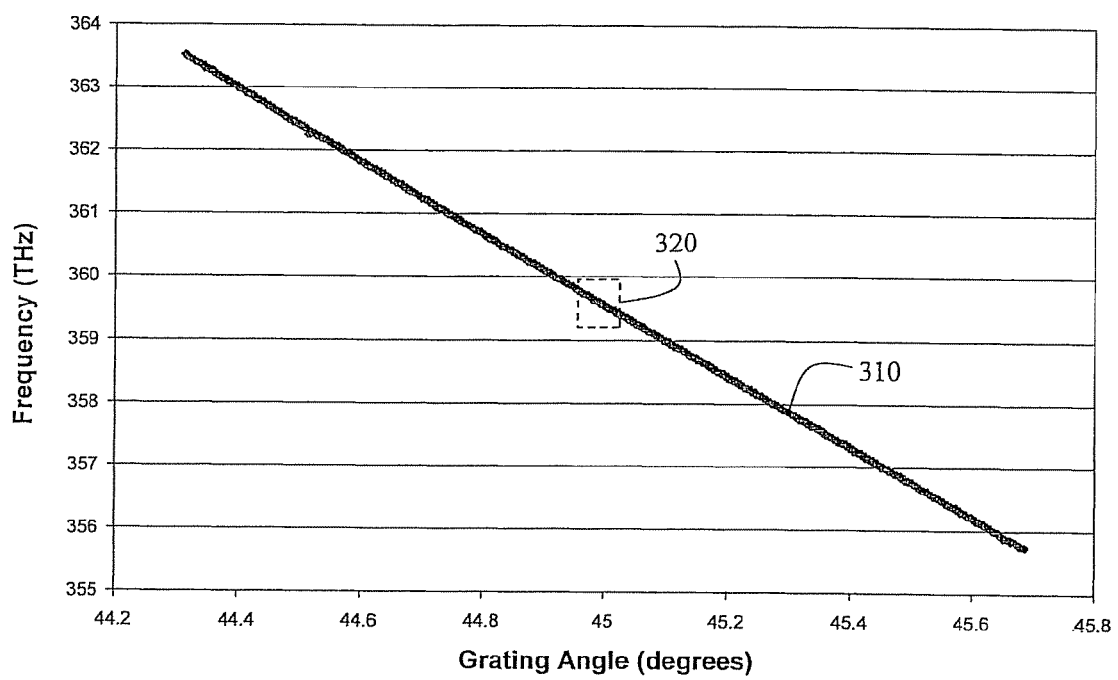
FIG. 3 shows an example of laser tuning behavior as the grating is angle-tuned around the nominal 45 degree Littrow angle, in embodiments of the disclosure.

FIG. 3 shows an example of laser tuning behavior (310) that can be achieved with a typical laser in the disclosed configuration as the grating is angle-tuned around the nominal 45 degree Littrow angle. The nominal frequency at 45 degrees corresponds to a wavelength of 834 nm. This exemplary laser is tuning over 8 THz or 18 nm centered around 359 THz or 834 nm. The frequency-stepped behavior of this laser is on a scale that cannot be readily discerned from the plot represented in FIG. 3. A portion (320) of line (310) is selected and represented in the magnified FIG. 4.

Figure 4:
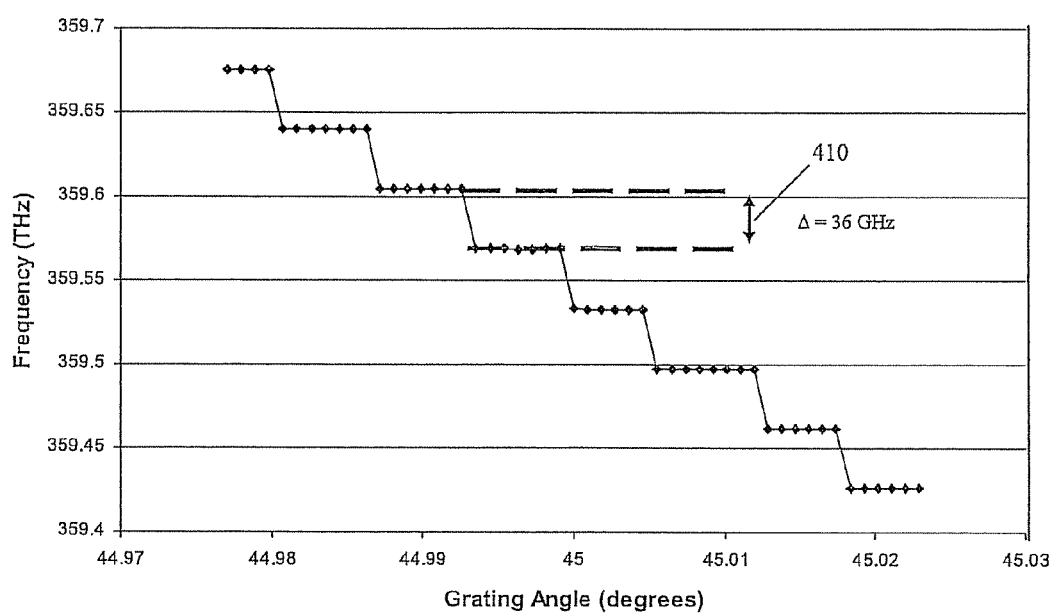
FIG. 4 represents a selected portion of the boxed data in FIG. 3 on a magnified scale to better view the frequency-stepped behavior of a continuously tuned laser as a function of grating angle, in embodiments of the disclosure.

FIG. 4 represents a selected portion of the data in FIG. 3 on a magnified scale to better view the frequency-stepped behavior of a continuously tuned laser as a function of grating angle. The scales on both axes are magnified to reveal the frequency-stepping behavior that is characteristic of this laser configuration. As the grating is continuously angle tuned, the laser frequency changes in discrete step sizes of 36 GHz. FIG. 4 magnifies the spectral tuning range to about 0.25 THz or 0.6 nm. On this scale, the discrete frequency jumps or mode hops (410) of the tunable laser can be readily seen, for example, as a frequency change ($\Delta v$) or separation of about 36 GHz. The longitudinal mode spacing of any laser cavity is given by the equation:

$$\Delta v = \frac{c}{2nL}$$

where c is the speed of light in vacuum, n is the index of refraction within the cavity, and L is the physical path length. The physical path length, L, is not the optical path length which is given by n times L. The mode-hops in FIG. 4 are about 36 GHz which corresponds to an optical path length of about 4.2 mm as calculated from the above equation.

Figure 5:
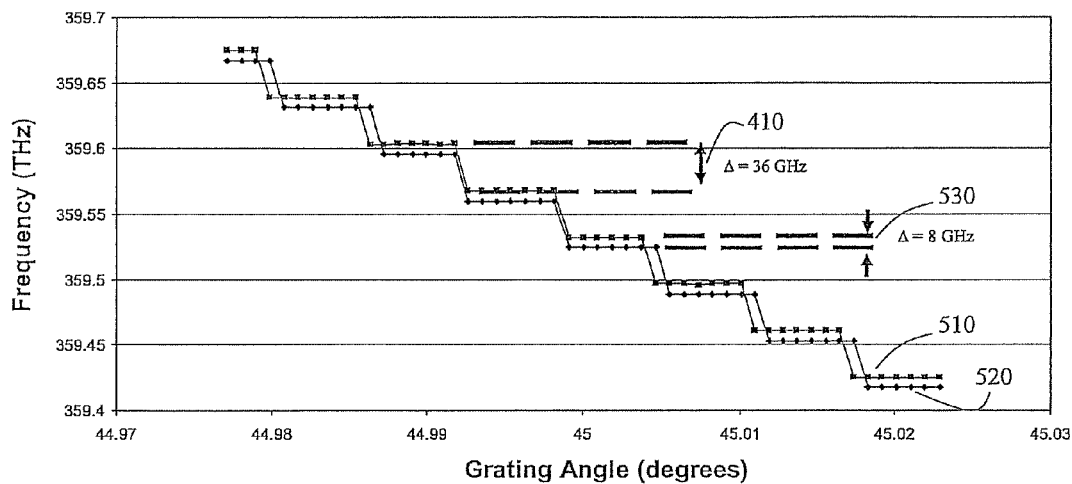
FIG. 5 shows two different continuously tuned laser frequency scans performed at two different laser currents which illustrate the frequency difference between hops and the frequency difference for different currents, in embodiments of the disclosure.

If the current used to drive the laser diode is changed, the relative orientation of the laser diode modes with respect to the external cavity modes also changes. The current can be adjusted so that the laser diode mode can be shifted by about one external cavity mode as shown in FIG. 2. At the adjusted current, the grating can be scanned and swept through a different set of longitudinal modes of the external cavity. The laser will still exhibit the same frequency-stepped behavior with the same size mode-hops but with a slight frequency shift ($\Delta v$=8 GHz) (530) as shown in FIG. 5. FIG. 5 shows two different continuously tuned laser frequency scans performed at two different laser currents ($I_1$ (510) and $I_2$ (520)). Each frequency scan shows the same 36 GHz mode stepping (410) behavior but the respective scans are shifted with respect to each other by the longitudinal mode spacing associated with the external cavity. Additional scans can be performed to achieve finer frequency resolution across all of the frequencies within the laser bandwidth.

Figure 6:
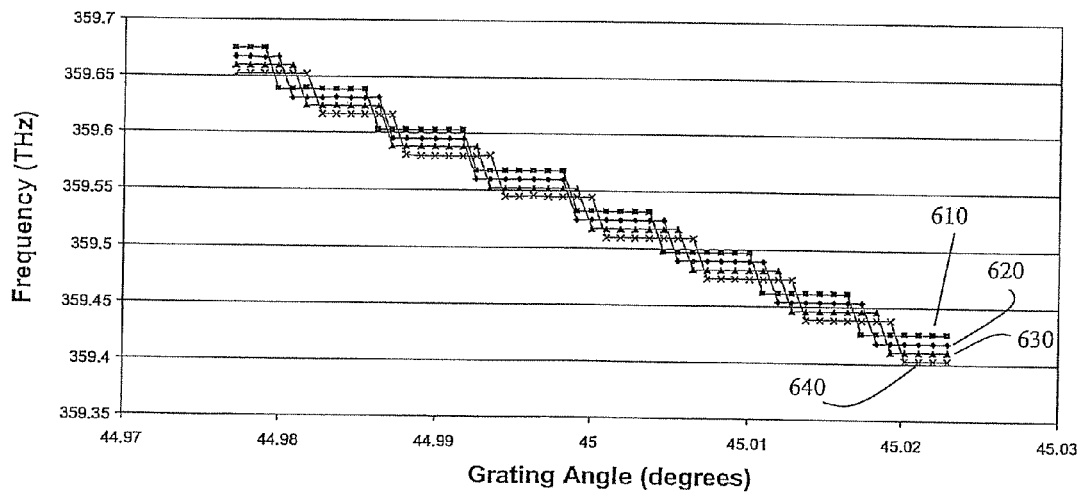
FIG. 6 shows that exemplary additional scans of four currents can be used to provide the higher resolution frequency steps, in embodiments of the disclosure.

The absolute frequency of the laser is shifted by the equivalent of about one external cavity mode. FIG. 6 shows that additional scans can be used to provide the higher resolution frequency steps. This process can be repeated, for example for four different currents ($I_1$ (610), $I_2$ (620), $I_3$ (630), $I_4$ (640)), in the vicinity of a grating angle of 45 degrees, to achieve the finer series of frequency steps which provide higher spectral resolution.

It is observed that the larger frequency shift which corresponds to the angle tuning of the grating (about 36 GHZ in the above example) is not an integer multiple of the finer frequency shift which corresponds to the current tuning (about 8 GHz in the above example). This implies that an even finer frequency resolution can be achieved with further current tuning.

In embodiments, the disclosure provides a wavelength tunable system comprising: wavelength tunable system comprising:

a laser having a lasing cavity and an external cavity, the cavities having a common optical axis, the lasing cavity and the external cavity being mode-matched such that the optical path length of the external cavity is an integer multiple of the optical path length of the lasing cavity and the external cavity includes a first set of modes corresponding to modes of the lasing cavity and a second set of modes offset from the first set of modes by less than a spacing of the lasing cavity modes;

a frequency-adjuster in the external cavity to spatially separate the frequency components of incident light and to select frequency components for feed-back into the lasing cavity; and an adjustable current source to adjust the laser diode current to a discrete set of different bias values to shift the modes of the lasing cavity into alignment with the second set of modes.

The system can further comprise an optical element to collimate the output of the lasing cavity into the external cavity, such as a collimator lens or an optical coupler. The frequency-adjuster can be, for example, a reflective grating.

In embodiments, the reflective grating can be, for example, incrementally rotatable about an axis that is co-planar with the face of the grating, the rotation axis is parallel to the rulings on the grating face, and the rotation axis is normal to the beam's propagation direction to retro-reflect the first diffracted order back into the laser cavity.

In embodiments, the grating can be, for example, fixed, and a first diffracted order is directed to a separate mirror that rotates about a pivot point on the face of the grating to retro-reflect the first diffracted order of the grating back into the laser cavity.

In embodiments, the disclosure provides a method for wavelength tuning a light source, the method comprising:

providing the above described system;

adjusting the frequency-adjuster to shift to successive laser diode cavity modes which are mode-matched to an external cavity mode at a first laser diode current (n); and adjusting the laser diode current to an (n+1) current and adjusting the frequency-adjuster to shift to successive laser diode cavity modes which are mode-matched to an external cavity and which are shifted in absolute frequency from the laser diode cavity modes at the first laser diode current (n).

The shift in absolute frequency between laser diode cavity modes at currents (n) and (n+1) can be, for example, finer than the frequency increments between successive laser diode cavity modes. Additionally or alternatively, the shift in absolute frequency between laser diode cavity modes at currents (n) and (n+m) can be, for example, finer than the frequency increments between laser diode cavity modes at currents (n) and (n+1). The n can be, for example, an integer from about 1 to about 1,000. The laser diode current can be, for example, from 10 mA to about 500 mA. The shift in absolute frequency between cavity modes is from about 0.1 GHz to about 20 GHz, and the frequency difference between successive laser cavity modes is from about 10 GHz to about 100 GHz.

In embodiments, the disclosed system can be a standalone laser or can be used with or incorporated into other articles or devices to form more complex or integrated systems. The laser or integrated systems can be used, for example, in measurement applications, optical sensing such as in a biosensor apparatus or method such as the Epic® system (Corning Inc.), medical treatment, telecommunications, and like applications.

EXAMPLES

The following example serves to more fully describe the manner of using the above-described disclosure, and to set forth examples of the best mode(s) contemplated for carrying out various aspects of the disclosure. It is understood that these examples do not limit the scope of this disclosure, but rather are presented for illustrative purposes.

Example 1

Numerous variations and alternatives can be used to implement the apparatus and method of the disclosure. One example apparatus configuration is illustrated in the perspective view of FIG. 1A. A conventional laser diode with an uncoated exit facet is used to illuminate a grating through an optically dispersive element such as a single-element aspheric lens which is used as a collimator. There are a variety of suitable laser diodes such as an aluminum gallium arsenide molecular quantum well (AlGaAs MQW) laser available from Mitsubishi Corporation with a central wavelength of 785 nm. The laser is positioned so that the exiting beam is at the focal point of the collimating lens. The collimated beam illuminates a grating. There are a number of candidates that can be used for the grating such as an 1800 lines/mm holographic grating with a magnesium fluoride protective overcoat available from Edmund Scientific.

During initial system setup and alignment, the lens and the laser diode is moved as an assembly along the lasing axis to achieve proper mode-matching between the laser diode and the external cavity. Once the proper mode-matching condition is achieved, the grating is rotated about the pivot point on the face of the grating to retro-reflect the $1^{st}$ diffracted order back into the laser diode. The zero'eth order is directed at the separate mirror (160) which rotates with the grating about the same pivot point. This keeps the reflected radiation from the mirror parallel to the laser axis.

The grating can be angularly tuned to sweep out a range of angles that changes the wavelength across the gain bandwidth of the laser. In this example, the grating can be tuned across a range of about 1.5 degrees to tune the laser from 775 nm to 795 nm. During this scan, the laser will manifest a step wise tuning behavior as illustrated in FIGS. 3 to 5. In this example the frequency increments can be about 50 GHz. Once the first scan is complete, the bias on the laser diode current is changed and the scan is repeated. Another set of laser wavelengths are generated over the same range (775-795 nm) with the same 50GHz frequency increments, but there will be an absolute shift between the first scan and the second scan. This absolute shift can be, for example, about 9 GHZ. The scan can be repeated 4 more times to generate similar scans with relative frequency shifts of about 18 GHz, 27 GHz, 36 GHz, and 45 GHz. These scans taken together represent a frequency resolution which about one-fifth of the frequency resolution of the original scan in this example.

If one continues to change the laser bias current, it is possible to generate even higher frequency resolution. Additional scans will generate frequency shifts of 54 GHz, 63 GHz, and 72 GHz. When these scans are compared to the earlier scans, the scan with the 54 GHz shift is only separated by 4 GHz from the first original scan. In this example, the frequency resolution is less than about one-tenth of the frequency resolution of the original scan. In this manner it is possible to achieve even higher frequency resolution. There is a practical limit on the range of laser currents that can be used to change the laser diode bias current, so this may not be extended indefinitely.

The disclosure has been described with reference to various specific embodiments and techniques. However, it should be understood that many variations and modifications are possible while remaining within the spirit and scope of the disclosure.

What is claimed is:

1. A wavelength tunable system comprising:
a laser having a laser diode cavity and an external cavity, the cavities having a common optical axis, the laser diode cavity and the external cavity being mode-matched such that the optical path length of the external cavity is an integer multiple of the optical path length of the laser diode cavity and the external cavity includes a first set of modes corresponding to modes of the laser diode cavity and a second set of modes offset from the first set of modes by less than a spacing of the laser diode cavity modes;
a frequency-adjuster in the external cavity to spatially separate the frequency components of incident light and to select frequency components for feed-back into the laser diode cavity; and
an adjustable current source to adjust the laser diode current to a discrete set of different bias values to shift the modes of the laser diode cavity into alignment with the second set of modes.

2. The system of claim 1 further comprising an optical element to collimate the output of the lasing cavity into the external cavity.

3. The system of claim 1 wherein the frequency-adjuster is a reflective grating.

4. The system of claim 3 wherein the reflective grating is incrementally rotatable about an axis that is co-planar with the face of the grating, the rotation axis is parallel to the rulings on the grating face, and the rotation axis is normal to the beam's propagation direction to retro-reflect the first diffracted order back into the laser cavity.

5. The system of claim 3 wherein the grating is fixed, and a first diffracted order is directed to a separate mirror that rotates about a pivot point on the face of the grating to retro-reflect the first diffracted order of the grating back into the laser cavity.

6. A method for wavelength tuning a light source, the method comprising:
providing the system of claim 1;
adjusting the frequency-adjuster to shift to successive laser diode cavity modes which are mode-matched to an external cavity mode at a first laser diode current (n); and
adjusting the laser diode current to an (n+1) current and adjusting the frequency-adjuster to shift to successive laser diode cavity modes which are mode-matched to an external cavity and which are shifted in absolute frequency from the laser diode cavity modes at the first laser diode current (n).

7. The method of claim 6 wherein the shift in absolute frequency between laser diode cavity modes at currents (n) and (n+1) is finer than the frequency increments between successive laser diode cavity modes.

8. The method of claim 6 wherein the shift in absolute frequency between laser diode cavity modes at currents (n) and (n+m) is finer than the frequency increments between laser diode cavity modes at currents (n) and (n+1).

9. The method of claim 6 wherein n is an integer from about 1 to about 1,000.

10. The method of claim 6 wherein laser diode current is from 10 mA to about 500 mA.

11. The method of claim 6 wherein the shift in absolute frequency between cavity modes is from about 0.1 GHz to about 20 GHz, and the frequency difference between successive laser cavity modes is from about 10 GHz to about 100 GHz.

* * * * *